United States Patent [19]

Freilich

[11] Patent Number: 5,147,518

[45] Date of Patent: Sep. 15, 1992

[54] PROCESS FOR ADHERING METAL TO POLYIMIDE FILM

[75] Inventor: Steven C. Freilich, Wilmington, Del.

[73] Assignee: E. I. Du Pont de Nemours and Company, Wilmington, Del.

[21] Appl. No.: 666,156

[22] Filed: Mar. 7, 1991

[51] Int. Cl.$^5$ ............ C23C 14/34; C23C 16/00; B05D 3/04
[52] U.S. Cl. ............ 204/192.14; 427/255; 427/306; 427/443.1
[58] Field of Search ............ 304/192.14, 192.15; 427/304, 305, 306, 307, 250, 255, 443.1

[56] References Cited

U.S. PATENT DOCUMENTS

| | | | |
|---|---|---|---|
| 4,517,254 | 5/1985 | Grapentin et al. | 428/626 |
| 4,775,449 | 10/1988 | Dumas et al. | 204/30 |
| 4,806,395 | 2/1989 | Walsh | 427/444 |
| 4,832,799 | 5/1989 | Knudsen et al. | 204/22 |
| 4,842,946 | 6/1989 | Foust et al. | 428/458 |
| 4,940,608 | 7/1990 | Kawagishi et al. | 427/306 X |
| 4,975,327 | 12/1990 | Somasiri et al. | 427/306 X |
| 5,008,153 | 4/1991 | Hayes | 427/306 X |

FOREIGN PATENT DOCUMENTS 1234254  3/1988  Canada .

*Primary Examiner*—Nam Nguyen

[57] ABSTRACT

This invention concerns a process for applying organic amino thiols to polyimide surfaces to improve the metal adhesion to such surfaces.

27 Claims, No Drawings

PROCESS FOR ADHERING METAL TO POLYIMIDE FILM

BACKGROUND OF THE INVENTION

1. Field of the Invention

This invention relates to a surface treatment method for increasing the adherence of plated metals to a base surface of polyimide. It also relates to a method for applying a metal coating to a surface-treated polyimide base material in an image-wise fashion.

2. Technical Background

Certain electronic assemblies involve the use of conductor traces on flexible dielectric substrate materials. Polyimides represent a preferred flexible dielectric substrate material, in part because of their excellent thermal stability and solvent resistance. Unfortunately, the direct adhesion of metals widely used in the electronics industry, for example gold, silver and copper, to polyimide base materials is quite poor without the use of adhesives. Further, the use of adhesives to form adhesive-bonded laminates is undesirable because, among other concerns, the resulting adhesive bonded laminates exhibit poor thermal and dimensional stability.

U.S. Pat. No. 4,517,254 discloses a method of metallization of a polyimide surface characterized in that the polyimide is pretreated with an aqueous solution of alkali hydroxide and an organic nitrogen compound such as N,N,N',N'-tetra-(2(hydroxypropyl)ethylenediamine, ethylenediaminetetraacetic acid and nitrilotriacetic acid. The utility of a number of other organic nitrogen compounds is disclosed, including some bearing sulfur atoms in the form of a sulfonic acid group. There is no disclosure nor suggestion of the utility of any thiol-containing compound for example, organic amino thiols, in such a process.

U.S. Pat. No. 4,775,449 discloses a method of improving the adhesion of metal applied on a polyimide surface characterized in that the surface is first treated with an adhesion promoting compound containing a nitrogen-oxygen moiety prior to plating of the metal thereon. The preferred adhesion promoting compound is a hydroxylamine. The preferred metal is copper. There is no disclosure nor suggestion of the utility of any thiol-containing compound for example, organic amino thiols, in such a process. There is no disclosure nor suggestion of the utility of any metal plating method besides electroless plating and electroplating.

U.S. Pat. No. 4,806,395 discloses a method for texturing the surface of a polyimide sheet by contacting the polyimide sheet with a one-phase solution of an amine, an alkali metal hydroxide, a water miscible alcohol and water. This textured coating can be coated with a layer of electroless nickel or cobalt and a subsequent layer of electrolytically applied copper to yield an adhesiveless laminate useful in the production of electronic circuitry. The polyimide surface is severely damaged by this process. No use of organic amino thiols is disclosed nor suggested.

U.S. Pat. No. 4,832,799 discloses a method for texturing the surface of a polyimide sheet by contacting the polyimide sheet with a one-phase solution of an alkylenediamine, an alkali metal hydroxide, a water miscible alcohol and water. This textured coating can be coated with a layer of electroless nickel or cobalt and a subsequent layer of electrolytically applied copper to yield an adhesiveless laminate useful in the production of electronic circuitry. No use of organic amino thiols is disclosed nor suggested.

U.S. Pat. No. 4,842,946 discloses a method for treating a polyimide surface in which an adhesion promoting compound contacts the surface prior to the electroless plating of metal thereon. The preferred adhesion promoting compound is thiourea. The preferred metal is copper. There is no disclosure nor suggestion of the utility of any thiol-containing compound for example, organic amino thiols, in such a process. There is no disclosure nor suggestion of the utility of any metal plating method besides electroless plating and electroplating.

A major disadvantage of previously described methods for increasing adhesion between polyimide surfaces and applied metallic layers is that the adhesion promoting treatments are overly aggressive and cause damage to the polyimide sub-surface layer. The process of the present invention is mild enough to cause no damage to the polyimide sub-surface. It can be used successfully on extremely thin films of polyimide material without damaging the thin film. In addition, unlike the previously described methods, surface treatments in the present invention is reduced to a single step.

OBJECTS OF THE INVENTION

Accordingly, it is one object of the invention to provide a process for improving the adhesion of metal to the surface of a polyimide substrate that is mild enough so as not to damage the polyimide surface.

A further object of the invention is to provide a method for treating a thin film of polyimide materials to improve adhesion of metals to it.

A still further object of the invention is to provide a process for applying metal to at least one surface of a polyimide substrate which has been treated with an organic amino thiol compound.

A further object of the invention is to apply a metal in a positive image-wise fashion to at least one surface of a polyimide substrate.

SUMMARY OF THE INVENTION

This invention provides a process for the treatment of at least one surface of a polyimide substrate to improve the adhesion of metal deposited thereon. The process comprises contacting the polyimide surface with a solution of an organic amino thiol prior to deposition of the metal on the polyimide surface.

This invention also provides a process for applying metal to at least one surface of a polyimide substrate which method comprises the steps of:
  a) contacting the polyimide surface with a solution of an organic amino thiol, and
  b) applying a layer of metal to the treated surface by means of sputtering or vapor deposition.

This invention also provides a process for applying metal in a positive image-wise fashion to at least one surface of a polyimide substrate which method comprises the steps of:
  a) contacting the polyimide surface with a solution of an organic amino thiol,
  b) irradiating the treated surface in an image-wise fashion,
  c) applying a layer of metal to the treated surface by means of sputtering or vapor deposition, and
  d) removing the non-adhering metal from the areas of the polyimide surface that were exposed to the actinic radiation.

DETAILED DESCRIPTION OF THE INVENTION

This invention provides a process for the treatment of one or more surfaces of a polyimide substrate to improve the adhesion of metal deposited thereon. The process comprises contacting the polyimide surface with a solution of an organic amino thiol prior to depositing metal on the treated surface.

This invention also provides a process for applying metal to at least one surface of a polyimide substrate which method comprises the steps of: a) contacting the polyimide surface with a solution of an organic amino thiol, and b) applying a layer of metal to the treated surface by means of sputtering or vapor deposition.

This invention also provides a process for applying metal in a positive image-wise fashion to at least one surface of a polyimide substrate which method comprises the steps of: a) contacting the polyimide surface with a solution of an organic amino thiol, b) irradiating the treated surface in an image-wise fashion, c) applying a layer of metal to the treated surface by means of sputtering or vapor deposition, and d) removing the nonadhering metal from the areas of the polyimide surface that were exposed to the actinic radiation.

The term "polyimide" is taken to be any polymeric or copolymeric substance which is a linear polymerized condensation product of diamines and at least one tetracarboxylic acid moiety in which the condensation product has the repeating unit

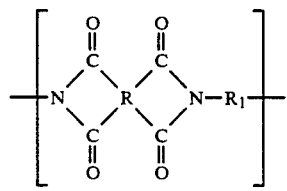

where R is an organic tetravalent radical containing at least two carbon atoms, said tetravalent radical being bonded to four carbonyl groups, no more than two carbonyl groups being bonded to any one carbon atom of said tetravalent radical, $R_1$ is an organic divalent radical containing at least two carbon atoms, said divalent radical being bonded to two nitrogen atoms, the said nitrogen atoms being attached to different carbon atoms of said divalent radical. Substances derived from pyromellitic dianhydride (PMDA) are preferred.

The organic amino thiol that functions in the present invention is an aliphatic thiol compound that bears a primary amino group. Examples of such compounds are 2-, 3-, 4-, 5-, or 6-aminohexanethiol, 2-, 3-, 4-, or 5-aminopentanethiol, 2-, 3-, or 4-aminobutanethiol, 2- or 3-aminopropanethiol, or 2-aminoethanethiol. Aminocycloalkanethiols can also be employed in this invention. 2-Aminoethanethiol is preferred.

The process is carried out in the presence of a solvent. Water is preferred. Other non-swelling or swelling solvents may be used.

Metals that can be utilized in the practice of this invention are selected from the group consisting of, but not limited to, silver, copper, gold, platinum and palladium. Copper is preferred.

Application of the selected metal is preferably by sputtering or by vapor deposition, although electroless or other methods can be employed.

The solution of organic amino thiol that is used in this invention is normally from about 1% w/w up to the limit of solubility. A preferred range is from about 5% w/w to about 10% w/w. About 10% w/w is the preferred concentration with 2-aminoethanethiol.

The contact of the polyimide surface with the solution of organic amino thiol is normally carried out at temperatures from about 50° C. up to about 100° C., or up to the approximate reflux temperature of the solution. For convenience, about 100° C. is preferred when using water as the solvent.

The time of treatment of the polyimide surface with the solution of organic amino thiol varies from about 1 minute up to about 120 minutes or more.

It has been shown (see example 1 and comparative example 4) that treatment with an aqueous solution of 2-aminoethanethiol results in metal layer adhesion superior to that obtained with thiourea as described in U.S. Pat. No. 4,842,946. Under similar adhesion test conditions a metal layer applied after treatment with thiourea showed a 45% failure rate while a metal layer applied after treatment by the process of this invention showed 0% failure.

When the process of this invention is employed for applying metal in a positive image wise fashion to at least one surface of a polyimide substrate, the initial treatment with a solution of an organic amino thiol yields a surface uniformly treated to enhance the adhesion of the subsequently applied metal thereto. The irradiation of the treated surface in an image-wise fashion destroys the adhesion promoting effect in the irradiated areas. When the metal layer is subsequently applied it covers the entire polyimide surface. In the formerly irradiated areas it has no enhanced adhesion, and from these areas, but not from the non-irradiated areas, the metal is easily removed leaving behind a positive metal image. For purposes of laboratory demonstration, the selective removal of metal is carried out with an adhesive tape, e.g. Scotch ® brand cellophane tape.

EXAMPLE 1

A coupon of Kapton ® polyimide film 3 mils thick was placed in a solution containing 10% by weight 2-aminoethanethiol in distilled water maintained at 100 degrees C. After 15 minutes of exposure, the film was removed and rinsed rapidly with methanol. The clean film was then air dried. The dried film was placed in an evaporation chamber (Balzers BAE 80T) and 200 Angstroms of metallic copper deposited on one film surface at $2 \times 10^{-5}$ Torr pressure. The film was removed from the chamber to reveal a film with a high lustre of copper. The copper layer was scored with a razor knife in 0.1 cm² grids. A peel test using Scotch ® brand adhesive tape revealed that less than 4% of the grids showed failure of adhesion between the polyimide film and the copper, as evidenced by the lack of copper removed upon stripping of the tape from the film surface.

EXAMPLE 2

A coupon of Kapton ® polyimide film 3 mils thick was placed in a distilled water maintained at 100° C. After 15 minutes of exposure, the film was removed and treated in a fashion identical to that outlined in Example 1. A peel test, as in Example 1, revealed that extensive failure of adhesion had taken place, with greater than 92% of the grids showing adhesive failure.

EXAMPLE 3

A coupon of Kapton ® polyimide film was prepared as in Example 1, with the exception of elemental gold being sputtered on the film in the place of copper. A peel test, as in Example 1, showed 0% adhesive failure. A control sample as prepared in Example 2 showed adhesive failure in 100% of the grids.

EXAMPLE 4

A coupon of Kapton ® polyimide film was treated as in Example 1 with the exception that the film was refluxed for one hour in an aqueous solution of 5% by weight thiourea. A tape peel test as in Example 1 showed 45% grid adhesive failure. This clearly demonstrates the advantages of aminoethanethiol over thiourea as an adhesion promoter.

EXAMPLE 5

A coupon of Kapton ® polyimide film was treated as in Example 1, with the exception that after 5 minutes of treatment with the adhesion promoting solution, rinsing with methanol, and drying, the film was imaged through a target with a 300 watt medium pressure xenon lamp filtered through a water filter to remove both ultraviolet (below 300 nm) and infra-red radiation. Illumination was continued for 4 minutes. Copper was then evaporated uniformly onto the film surface as in Example 1. Stripping of the surface with Scotch ® brand adhesive tape gave complete removal of the metal through adhesive failure in the illuminated regions only.

Although preferred embodiments of the invention have been described and exemplified in the above disclosure, it is to be understood that that there is no intent to limit the inventions to the precise examples herein disclosed and it is to be further understood that the right is reserved to all changes and modifications coming within the scope of the invention as defined by the appended claims.

I claim:

1. A process for the treatment of at least one surface of a polyimide substrate to improve the adhesion of metal deposited thereon in the absence of an adhesive comprising contacting the polyimide surface with a solution of an organic amino thiol, in a solvent, then applying a metal to the coated surface.

2. The process of claim 1 wherein the amino thiol is an aliphatic thiol that bears a primary amino group.

3. The process of claim 2 wherein the amino thiol is selected from 2-, 3-, 4-, 5-, or 6-aminohexanethiol, 2-, 3-, 4-, or 5-aminopentanethiol, 2-, 3-, 4-aminobutanethiol, 2- or 3-aminopropanethiol, 2-aminothanethiol and an aminocycloalkanethiol.

4. The process of claim 3 wherein the amino thiol is 2-aminoethanethiol.

5. The process of claim 4 wherein the solvent is water and the concentration of 2-aminoethanethiol is 10% w/w.

6. The process of claim 2 wherein the metal to be deposited is selected from silver, copper, gold, platinum and palladium.

7. The process of claim 6 wherein the metal is copper.

8. The process of claim 7 wherein the solvent is water.

9. The process of claim 8 wherein the solution or organic amino thiol is from 1% w/w up to the limit of solubility.

10. The process of claim 9 wherein the solution of organic amino thiol is from about 5% w/w to about 10% w/w.

11. The process of claim 1 wherein the metal is applied to the coated surface by sputtering, vapor deposition or electroless means.

12. The process of claim 1 wherein the solvent is non-swelling.

13. The process of claim 1 wherein the solvent is a swelling solvent.

14. The process of claim 1 wherein contact of the polyimide surface with the solution of organic amino thiol is carried out at temperatures from about 50° C. to about 100° C.

15. A process for applying metal in a positive image-wise fashion to at least one surface of a polyimide substrate which method comprises the steps of:
   a) contacting the polyimide surface with a solution of an organic amino thiol, in a solvent,
   b) irradiating the treated surface in an image-wise fashion,
   c) applying a layer of metal to the treated surface by means of sputtering or vapor deposition, and
   d) removing the non-adhering metal from the areas of the polyimide surface that were irradiated in step "b".

16. The process of claim 15 wherein the amino thiol is an aliphatic thiol that bears a primary amino group.

17. The process of claim 16 wherein the amino thiol is selected from 2-, 3-, 4-, 5-, or 6-aminohexanethiol, 2-, 3-, 4-, or 5-aminopentanethiol, 2-, 3-, or 4-aminobutanethiol 2- or 3-aminopropanethiol, 2-aminoethanethiol, and an aminocycloalkanethiol.

18. The process of claim 17 wherein the amino thiol is 2-aminothanethiol.

19. The process of claim 18 wherein the solvent is water and the concentration of 2-aminothanethiol is 10% w/w.

20. The process of claim 15 wherein the metal to be deposited is selected from silver, copper, gold, platinum and palladium.

21. The process of claim 20 wherein the metal is copper.

22. The process of claim 15 wherein the solvent is non-swelling.

23. The process of claim 22 wherein the solvent is water.

24. The process of claim 15 wherein the solvent is a swelling solvent.

25. The process of claim 15 wherein the solution of organic amino thiol is from 1% w/w up to the limit of solubility.

26. The process of claim 25 wherein the solution of organic amino thiol is from about 5% w/w to about 10% w/w.

27. The process of claim 15 wherein contact of the polyimide surface with the solution of organic amino thiol is carried out at temperatures from about 50° C. to about 100° C.

* * * * *